(12) United States Patent
Hsu et al.

(10) Patent No.: US 8,368,003 B2
(45) Date of Patent: Feb. 5, 2013

(54) IMAGE-CAPTURING MODULE FOR SIMPLIFYING OPTICAL COMPONENT AND REDUCING ASSEMBLY TIME

(75) Inventors: Chi-Hsing Hsu, Taipei (TW); Chih-Chien Chen, Taipei (TW)

(73) Assignee: Azurewave Technologies, Inc., Taipei (TW)

( * ) Notice: Subject to any disclaimer, the term of this patent is extended or adjusted under 35 U.S.C. 154(b) by 472 days.

(21) Appl. No.: 12/762,584

(22) Filed: Apr. 19, 2010

(65) Prior Publication Data

US 2011/0253885 A1 Oct. 20, 2011

(51) Int. Cl.
*H01L 31/0232* (2006.01)
(52) U.S. Cl. ........ 250/227.2; 250/239; 356/71; 382/124
(58) Field of Classification Search ............... 250/227.2, 250/239; 356/71; 382/124–127
See application file for complete search history.

(56) References Cited

U.S. PATENT DOCUMENTS

| 5,974,162 | A  | * | 10/1999 | Metz et al. | .............. | 382/124 |
| 5,986,746 | A  | * | 11/1999 | Metz et al. | .............. | 356/71 |
| 2005/0036665 | A1 | * | 2/2005 | Higuchi | ............. | 382/124 |
| 2008/0197437 | A1 | * | 8/2008 | Sugimoto et al. | ........ | 257/432 |

* cited by examiner

*Primary Examiner* — Seung C Sohn
(74) *Attorney, Agent, or Firm* — Rosenberg, Klein & Lee

(57) ABSTRACT

An image-capturing module for simplifying optical component and reducing assembly time includes a substrate unit, an image-capturing unit, a cover unit, a light-emitting unit and an optical imaging unit. The image-capturing unit has at least one image-capturing element electrically disposed on the substrate unit. The cover unit has at least one cover element disposed on the substrate unit and covering the image-capturing element, and the cover element has an opening for exposing the image-capturing element. The light-emitting unit has at least one light-emitting element electrically disposed on the substrate unit. The optical imaging unit has a light-guiding element disposed on the cover element for receiving light beams generated by the light-emitting element and an imaging element connected with the light-guiding element and disposed in the opening of the covering element. The light-guiding element and the imaging element are integrated with each other to form one piece.

13 Claims, 2 Drawing Sheets

IMAGE-CAPTURING MODULE FOR SIMPLIFYING OPTICAL COMPONENT AND REDUCING ASSEMBLY TIME

BACKGROUND OF THE INVENTION

1. Field of the Invention

The present invention relates to an image-capturing module, in particular, to an image-capturing module for simplifying optical component and reducing assembly time.

2. Description of Related Art

A personal fingerprint is a unique bio-feature different from those of others. When used as a personal secret code, it is extremely secure. Because of the popularity of electronic device and the increase of their storage capacities, the protection for personal data stored therein becomes increasingly important. Using a fingerprint for unlocking electronic device or as a secret code can make management of personal data more efficient. Electronic device such as a mobile phone, a computer host, and various kinds of computer peripherals can make use of a fingerprint scanning device to capture a user's fingerprint for identity confirmation. After the fingerprint image in the fingerprint scanning device is converted into digital fingerprint information, it is easy to transmit the digital fingerprint information to a controller in the electronic device to exploit fully the effect of fingerprint identification.

Referring to FIG. 1, the related art provides an image-capturing module including a PCB P, an image sensor S electrically disposed on the PCB P, an LED D electrically disposed on the PCB P, a condensing lens G disposed above the image sensor S, and a light-guiding element T disposed above the LED D. The image capturing process of the related art is shown as follows: (1) light beams L generated by the LED D are guided by the light-guiding element T to form a projecting light beams L' that project onto the object F above the condensing lens G; next (2) the projecting light beams L' are reflected by the object F to form reflecting light beams L" that project onto the condensing lens G; and then (3) the reflecting light beams L" pass through the condensing lens G and project onto the image sensor S in order to capture the image information of one surface of the object F.

SUMMARY OF THE INVENTION

In view of the aforementioned issues, the present invention provides an image-capturing module in order to simplify optical component and reduce assembly time.

To achieve the above-mentioned objectives, the present invention provides an image-capturing module for simplifying optical component and reducing assembly time, including: a substrate unit, an image-capturing unit, a cover unit, a light-emitting unit and an optical imaging unit. The substrate unit has a bottom substrate, a middle substrate extended upwards from one end of the bottom substrate, and a top substrate extended outwards from one end of the middle substrate and corresponding to the bottom substrate. The image-capturing unit has at least one image-capturing element electrically disposed on the bottom substrate. The cover unit has at least one cover element disposed on the bottom substrate and covering the at least one image-capturing element, and the at least one cover element has an opening for exposing the at least one image-capturing element. The light-emitting unit has at least one light-emitting element electrically disposed on the top substrate and between the top substrate and the bottom substrate. The optical imaging unit has a light-guiding element disposed on the at least one cover element for receiving light beams generated by the at least one light-emitting element and an imaging element connected with the light-guiding element and disposed in the opening of the at least one covering element. The light-guiding element and the imaging element are integrated with each other to form one piece.

To achieve the above-mentioned objectives, the present invention provides an image-capturing module for simplifying optical component and reducing assembly time, including: a substrate unit, a conductive unit, an image-capturing unit, a cover unit, a light-emitting unit and an optical imaging unit. The substrate unit has a bottom substrate and a top substrate disposed above the bottom substrate and corresponding to the bottom substrate. The conductive unit has at least one conductive element electrically connected between the bottom substrate and the top substrate. The image-capturing unit has at least one image-capturing element electrically disposed on the bottom substrate. The cover unit has at least one cover element disposed on the bottom substrate and covering the at least one image-capturing element, and the at least one cover element has an opening for exposing the at least one image-capturing element. The light-emitting unit having at least one light-emitting element electrically disposed on the top substrate and between the top substrate and the bottom substrate. The optical imaging unit has a light-guiding element disposed on the at least one cover element for receiving light beams generated by the at least one light-emitting element and an imaging element connected with the light-guiding element and disposed in the opening of the at least one covering element. The light-guiding element and the imaging element are integrated with each other to form one piece.

To achieve the above-mentioned objectives, the present invention provides an image-capturing module for simplifying optical component and reducing assembly time, including: a substrate unit, an image-capturing unit, a cover unit, a light-emitting unit and an optical imaging unit. The image-capturing unit has at least one image-capturing element electrically disposed on the substrate unit. The cover unit has at least one cover element disposed on the substrate unit and covering the at least one image-capturing element, and the at least one cover element has an opening for exposing the at least one image-capturing element. The light-emitting unit has at least one light-emitting element electrically disposed on the substrate unit. The optical imaging unit has a light-guiding element disposed on the at least one cover element for receiving light beams generated by the at least one light-emitting element and an imaging element connected with the light-guiding element and disposed in the opening of the at least one covering element. The light-guiding element and the imaging element are integrated with each other to form one piece.

Therefore, because the light-guiding element and the imaging element are integrated with each other to form one piece, the optical component is simplified and the assembly time is reduced in the present invention.

In order to further understand the techniques, means and effects the present invention takes for achieving the prescribed objectives, the following detailed descriptions and appended drawings are hereby referred, such that, through which, the purposes, features and aspects of the present invention may be thoroughly and concretely appreciated; however, the appended drawings are provided solely for reference and illustration, without any intention that they be used for limiting the present invention.

DETAILED DESCRIPTION OF THE PREFERRED EMBODIMENTS

Figure 1:
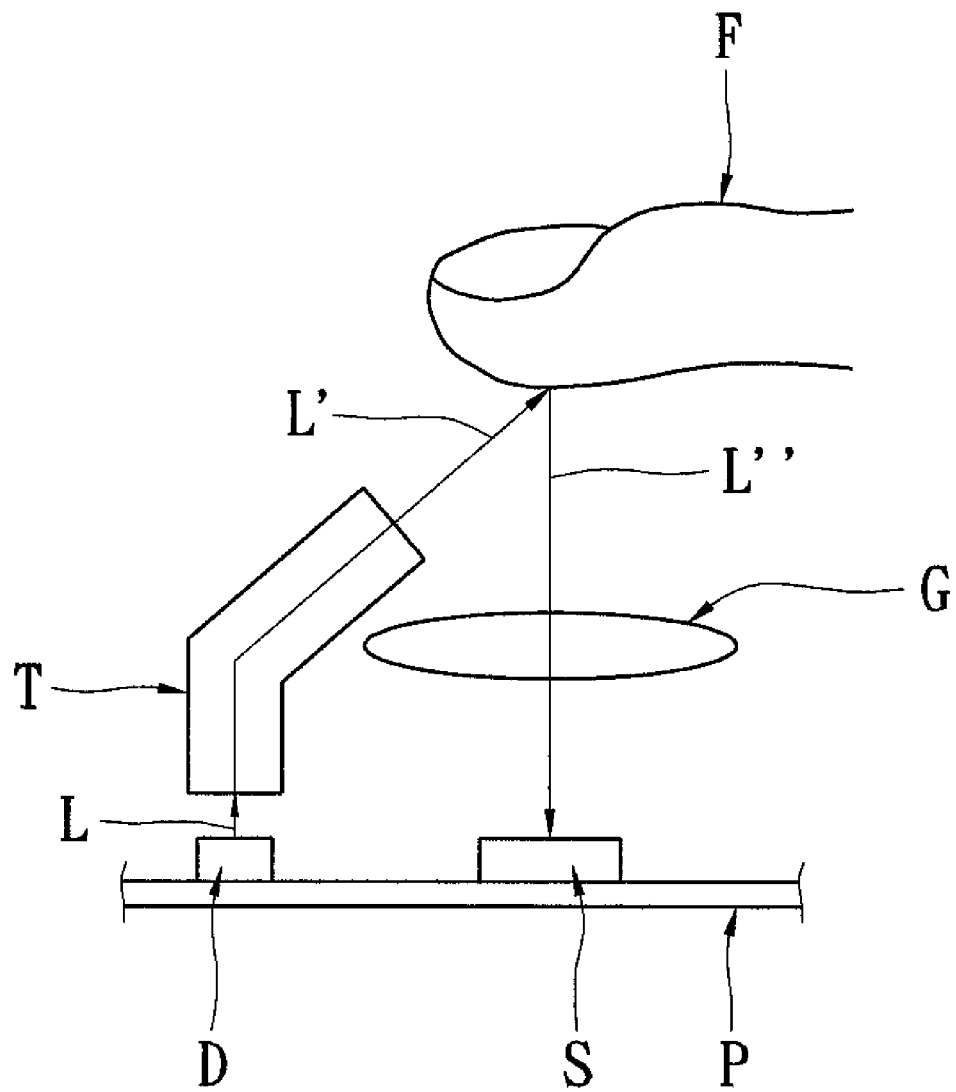
FIG. 1 is a schematic view of the image-capturing module according to the related art.
Figure 2:
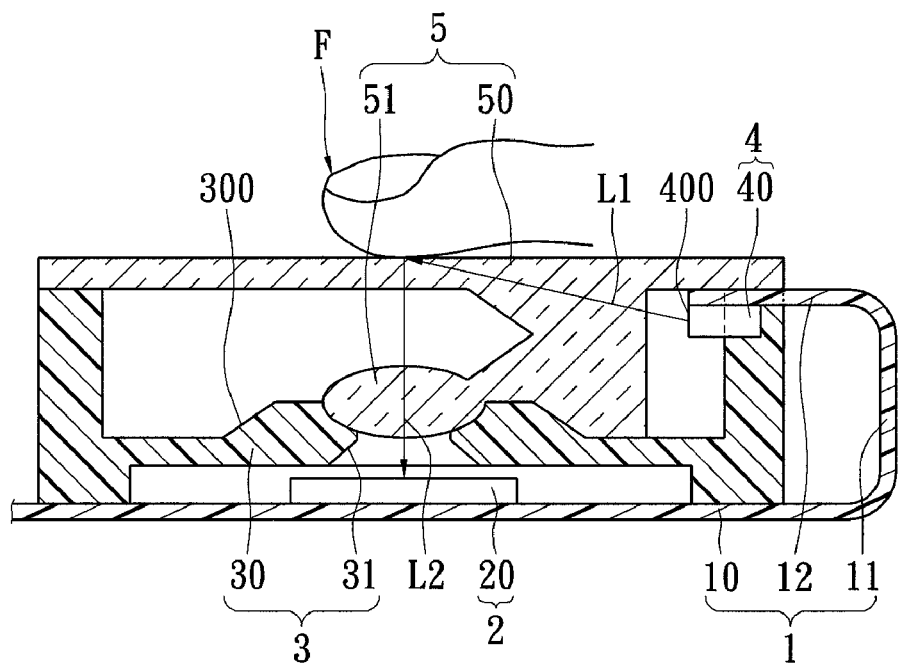
FIG. 2 is a lateral, cross-sectional, schematic view of the image-capturing module for simplifying optical component and reducing assembly time according to the first embodiment of the present invention.

Referring to FIG. 2, the first embodiment of the present invention provides an image-capturing module for simplifying optical component and reducing assembly time, including: a substrate unit 1, an image-capturing unit 2, a cover unit 3, a light-emitting unit 4 and an optical imaging unit 5.

The substrate unit 1 has a bottom substrate 10, a middle substrate 11 extended upwards from one end of the bottom substrate 10, and a top substrate 12 extended outwards from one end of the middle substrate 11 and corresponding to the bottom substrate 10. In addition, the top substrate 12 and the bottom substrate 10 are respectively extended from two ends of the middle substrate 11 along the same direction, so that the cross-sectional view of the substrate unit 1 is similar to a U shape.

In addition, the substrate unit 1 may be a flexible substrate (it means the bottom substrate 10, the middle substrate 11 and the top substrate 12 are flexible substrates), or the bottom substrate 10 may be a hard substrate and the middle substrate 11 and the top substrate 12 may be flexible substrates, according to different requirements. In the first embodiment, the bottom substrate 10 is a hard substrate, and the middle substrate 11 and the top substrate 12 are flexible substrates. Hence, the middle substrate 11 and the top substrate 12 may be bent according to different requirements.

Furthermore, the image-capturing unit 2 has at least one image-capturing element 20 electrically disposed on the bottom substrate 10, so that the number of the image-capturing element 20 may be adjustable according to different requirements. The image-capturing element 20 may be an image sensor, and the image-capturing element 20 can electrically connect to analysis software in computer in order to read image information that is captured by the image-capturing element 20.

Moreover, the cover unit 3 has at least one cover element 30 disposed on the bottom substrate 10 and covering the at least one image-capturing element 20. For example, a shading layer is coated on an outer surface 300 or an inner surface of the cover element 30 in order to achieve anti stray light function. The cover element 30 has an opening 31 for exposing the at least one image-capturing element 20. Hence, the light beams are projected onto the image-capturing element 20 along a predetermined path by using the cover element 30 (it means the cover element 30 can shade other external stray light), so that the image-capturing element 20 can obtain correct image information.

In addition, the light-emitting unit 4 has at least one light-emitting element 40 electrically disposed on the top substrate 12 and between the top substrate 12 and the bottom substrate 10, and the light-emitting element 40 may be an LED. In the first embodiment, the light-emitting element 40 has a light-emitting surface 400 facing the optical imaging unit 5.

Besides, the optical imaging unit 5 has a light-guiding element 50 disposed on the at least one cover element 30 for receiving light beams L1 generated by the at least one light-emitting element 40 and an imaging element 51 connected with the light-guiding element 50 and disposed in the opening 31 of the at least one covering element 30. The opening 31 may be fully covered by the imaging element 51, and the light-guiding element 50 and the imaging element 51 are integrated with each other to form one piece. In the first embodiment, the light-guiding element 50 has two opposite lateral sides respectively disposed on two opposite lateral sides of the at least one cover element 30, and the light-guiding element 50 has a bottom side contacting a top surface of the at least one cover element 30.

An object F may be disposed on the light-guiding element 50 for sensing the image of the object F. In other words, the sensing surface of the object F (such as fingerprint of finger) may be disposed on the light-guiding element 50 to be sensed.

Therefore, the light beams L1 generated by the light-emitting element 40 are projected onto the light-guiding element 50, then the light beams L1 are guided to project onto the object F by the light-guiding element 50, next the light beams L1 are reflected by the object F to form a reflected light beams L2 that are projected onto the imaging element 51 of the optical imaging unit 5, and then the reflected light beams L2 pass through the imaging element 51 and project onto the image-capturing element 20 in order capture the image information of one surface of the object F.

Figure 3:
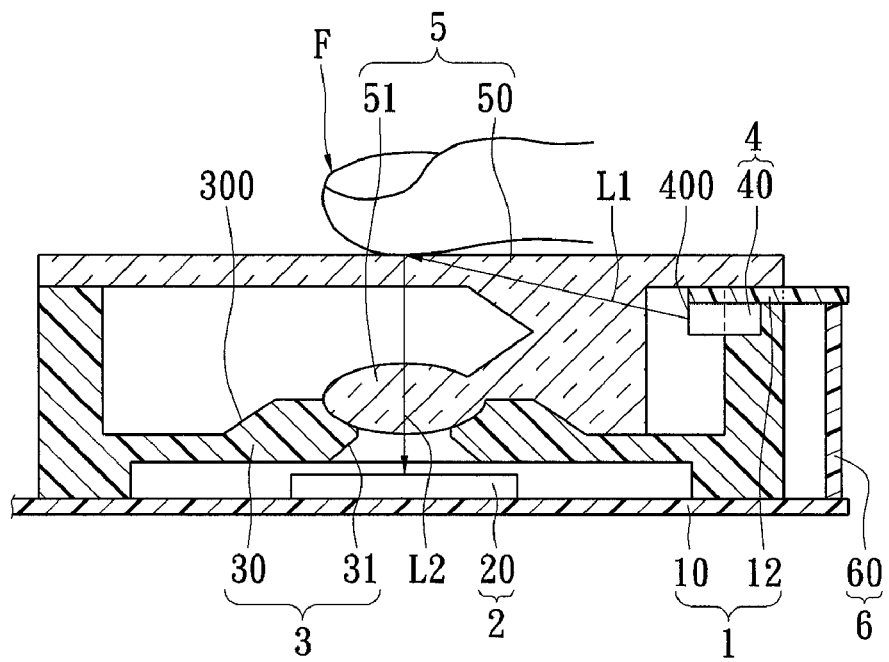
FIG. 3 is a lateral, cross-sectional, schematic view of the image-capturing module for simplifying optical component and reducing assembly time according to the first embodiment of the present invention.

Referring to FIG. 3, the second embodiment of the present invention provides an image-capturing module for simplifying optical component and reducing assembly time, including: a substrate unit 1, a conductive unit 6, an image-capturing unit 2, a cover unit 3, a light-emitting unit 4 and an optical imaging unit 5. The difference between the second embodiment and the first embodiment is that: in the second embodiment, the substrate unit 1 has a bottom substrate 10 and a top substrate 12 disposed above the bottom substrate 10 and corresponding to the bottom substrate 10, and the conductive unit 6 has at least one conductive element 60 electrically connected between the bottom substrate 10 and the top substrate 12. In addition, the bottom substrate 10 may be a hard substrate or a flexible substrate, and the top substrate 12 may be a hard substrate or a flexible substrate.

In addition, the conductive element 60 has many different embodiments according to different requirements. For example, the conductive element 60 may be composed of a plurality of conductive wires, the conductive element 60 may be a flexible PCB, or the conductive element 60 may be composed of a plurality of solder balls. Hence, any member with conducting power may be applied to the present invention.

In conclusion, the light-guiding element and the imaging element are integrated with each other to form one piece, so that the optical component is simplified and the assembly time is reduced in the present invention.

The above-mentioned descriptions merely represent solely the preferred embodiments of the present invention, without any intention or ability to limit the scope of the present invention which is fully described only within the following claims. Various equivalent changes, alterations or modifications based on the claims of present invention are all, consequently, viewed as being embraced by the scope of the present invention.

What is claimed is:

1. An image-capturing module for simplifying optical component and reducing assembly time, comprising:

a substrate unit having a bottom substrate, a middle substrate extended upwards from one end of the bottom substrate, and a top substrate extended outwards from one end of the middle substrate and corresponding to the bottom substrate;

an image-capturing unit having at least one image-capturing element electrically disposed on the bottom substrate;
a cover unit having at least one cover element disposed on the bottom substrate and covering the at least one image-capturing element, wherein the at least one cover element has an opening for exposing the at least one image-capturing element;
a light-emitting unit having at least one light-emitting element electrically disposed on the top substrate and between the top substrate and the bottom substrate; and
an optical imaging unit having a light-guiding element disposed on the at least one cover element for receiving light beams generated by the at least one light-emitting element and an imaging element connected with the light-guiding element and disposed in the opening of the at least one covering element, wherein the light-guiding element and the imaging element are integrated with each other to form one piece.

2. The image-capturing module according to claim 1, wherein the top substrate and the bottom substrate are extended from the middle substrate along the same direction.

3. The image-capturing module according to claim 1, wherein the bottom substrate, the middle substrate and the top substrate are flexible substrates.

4. The image-capturing module according to claim 1, wherein the bottom substrate is a hard substrate, and the middle substrate and the top substrate are flexible substrates.

5. The image-capturing module according to claim 1, wherein the light-guiding element has two opposite lateral sides respectively disposed on two opposite lateral sides of the at least one cover element, and the light-guiding element has a bottom side contacting a top surface of the at least one cover element.

6. An image-capturing module for simplifying optical component and reducing assembly time, comprising:
a substrate unit having a bottom substrate and a top substrate disposed above the bottom substrate and corresponding to the bottom substrate;
a conductive unit having at least one conductive element electrically connected between the bottom substrate and the top substrate;
an image-capturing unit having at least one image-capturing element electrically disposed on the bottom substrate;
a cover unit having at least one cover element disposed on the bottom substrate and covering the at least one image-capturing element, wherein the at least one cover element has an opening for exposing the at least one image-capturing element;
a light-emitting unit having at least one light-emitting element electrically disposed on the top substrate and between the top substrate and the bottom substrate; and
an optical imaging unit having a light-guiding element disposed on the at least one cover element for receiving light beams generated by the at least one light-emitting element and an imaging element connected with the light-guiding element and disposed in the opening of the at least one covering element, wherein the light-guiding element and the imaging element are integrated with each other to form one piece.

7. The image-capturing module according to claim 6, wherein the bottom substrate is a hard substrate or a flexible substrate, and the top substrate is a hard substrate or a flexible substrate.

8. The image-capturing module according to claim 6, wherein the at least one conductive element is composed of a plurality of conductive wires.

9. The image-capturing module according to claim 6, wherein the at least one conductive element is a flexible PCB.

10. The image-capturing module according to claim 6, wherein the light-guiding element has two opposite lateral sides respectively disposed on two opposite lateral sides of the at least one cover element, and the light-guiding element has a bottom side contacting a top surface of the at least one cover element.

11. An image-capturing module for simplifying optical component and reducing assembly time, comprising:
a substrate unit;
an image-capturing unit having at least one image-capturing element electrically disposed on the substrate unit;
a cover unit having at least one cover element disposed on the substrate unit and covering the at least one image-capturing element, wherein the at least one cover element has an opening for exposing the at least one image-capturing element;
a light-emitting unit having at least one light-emitting element electrically disposed on the substrate unit; and
an optical imaging unit having a light-guiding element disposed on the at least one cover element for receiving light beams generated by the at least one light-emitting element and an imaging element connected with the light-guiding element and disposed in the opening of the at least one covering element, wherein the light-guiding element and the imaging element are integrated with each other to form one piece.

12. The image-capturing module according to claim 11, wherein the substrate unit is a flexible substrate or a hard substrate.

13. The image-capturing module according to claim 11, wherein the light-guiding element has two opposite lateral sides respectively disposed on two opposite lateral sides of the at least one cover element, and the light-guiding element has a bottom side contacting a top surface of the at least one cover element.

* * * * *